United States Patent
Bucher et al.

(10) Patent No.: US 11,291,140 B2
(45) Date of Patent: Mar. 29, 2022

(54) HEAT SINK ASSEMBLY FOR AN ELECTRICAL COMPONENT

(71) Applicant: TE Connectivity Services GmbH, Schaffhausen (CH)

(72) Inventors: Alan Weir Bucher, Manheim, PA (US); Leo Joseph Graham, Hershey, PA (US)

(73) Assignee: TEC CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 16/927,446

(22) Filed: Jul. 13, 2020

(65) Prior Publication Data
US 2022/0015267 A1    Jan. 13, 2022

(51) Int. Cl.
H05K 7/20 (2006.01)
H01L 23/367 (2006.01)
H05K 1/02 (2006.01)

(52) U.S. Cl.
CPC ..... H05K 7/20509 (2013.01); H01L 23/3672 (2013.01); H05K 1/0203 (2013.01); H05K 7/2049 (2013.01)

(58) Field of Classification Search
CPC .............. H05K 7/2039; H05K 7/2049; H05K 7/20509; H05K 1/0203; H01L 2023/405; H01L 2023/4075–4087
USPC ....... 361/704, 709–710, 719; 165/80.2–80.3; 257/718–719
See application file for complete search history.

(56) References Cited

U.S. PATENT DOCUMENTS

| | | | | |
|---|---|---|---|---|
| 5,201,866 A | * | 4/1993 | Mok | F28F 3/02 165/185 |
| 6,286,586 B2 | * | 9/2001 | Cook | H01L 23/40 165/185 |
| 7,336,492 B2 | * | 2/2008 | Yu | H01L 23/4093 165/104.33 |
| 7,746,646 B2 | * | 6/2010 | Kuo | H01L 23/4093 361/709 |
| 9,620,890 B1 | | 4/2017 | Vino, IV et al. | |
| 9,668,380 B2 | | 5/2017 | Bucher | |
| 9,841,772 B2 | | 12/2017 | Bucher | |
| 9,912,107 B2 | | 3/2018 | Bucher | |
| 10,993,352 B2 | | 4/2021 | Bucher | |
| 2010/0314073 A1 | * | 12/2010 | Zhao | H01L 23/4093 165/80.3 |

(Continued)

OTHER PUBLICATIONS

Corresponding U.S. Appl. No. 16/856,129, filed Apr. 23, 2020 (33 pages).

*Primary Examiner* — Zachary Pape

(57) ABSTRACT

A heat sink assembly includes a plate stack including fin plates and spacer plates with bottom edges forming a compliant thermal interface configured to interface with an electrical component. Upper edges of the fin plates are located above the spacer plates to form airflow channels between the fin plates. The heat sink assembly includes a support frame supporting the fin plates and the spacer plates in the plate stack. The support frame includes a spring support member engaging a spring element to locate the spring element relative to the support frame. The spring element engages the fin plates and the spacer plates to bias the fin plates and the spacer plates in a first biasing direction generally toward the electrical component to press the bottom edges of the fin plates and the spacer plates against the electrical component.

20 Claims, 8 Drawing Sheets

(56) References Cited

U.S. PATENT DOCUMENTS

2020/0373706 A1  11/2020  Bucher et al.
2021/0084791 A1   3/2021  Bucher

* cited by examiner

HEAT SINK ASSEMBLY FOR AN ELECTRICAL COMPONENT

BACKGROUND OF THE INVENTION

The subject matter herein relates generally to heat dissipation for electrical components.

It may be desirable to transfer thermal energy (or heat) away from designated components of a system or device. Some systems use electrical components, such as electrical connectors, to transmit data and/or electrical power to and from different systems or devices. Some systems use electrical components, such as pluggable modules for transmitting data signals through communication cable(s) in the form of optical signals and/or electrical signals. Some systems use electrical components, such as integrated circuits, for controlling the system. The electrical components define heat generating sources within the system.

A common challenge that confronts developers of electrical systems is heat management. Thermal energy generated by electrical components within a system can degrade performance or even damage components of the system. To dissipate the thermal energy, systems include a thermal component, which engages the heat source, absorbs the thermal energy from the heat source, and transfers the thermal energy away. The thermal component typically includes a flat thermal interface for interfacing with the electrical component. However, it is difficult to achieve efficient thermal coupling at the interfaces due to limited thermal interface areas and variations in the surfaces, such as due to surface flatness of the interfacing surfaces. Additionally, the thermal component may be thermally coupled to another thermal component at yet another thermal interface. The components lose efficiency at each thermal interface.

Accordingly, there is a need for a thermal transfer assembly that efficiently transfers thermal energy away from an electrical component.

BRIEF DESCRIPTION OF THE INVENTION

In one embodiment, a heat sink assembly is provided. The heat sink assembly includes a plate stack including fin plates and spacer plates arranged between the fin plates in a stacked arrangement. Each fin plate has a top edge and a bottom edge. Each fin plate has a first side between the top and bottom edges. Each fin plate has a second side opposite the first side between the top and bottom edges. Each spacer plate has a top edge and a bottom edge. Each spacer plate has a first side between the top and bottom edges. Each spacer plate has a second side opposite the first side between the top and bottom edges. The first and second sides of the spacer plates face the corresponding first and second sides of the fin plates. The bottom edges of the fin plates and the bottom edges of the spacer plates form a compliant thermal interface configured to interface with an electrical component. The upper edges of the fin plates are located above the upper edges of the spacer plates such that airflow channels are formed above the spacer plates between the fin plates. The heat sink assembly includes a support frame supporting the fin plates and the spacer plates in the plate stack. The support frame includes a spring support member extending internally within the plate stack. The heat sink assembly includes a spring element extending internally within the plate stack. The spring element engages the spring support member to locate the spring element relative to the support frame. The spring element engages the fin plates and the spacer plates to bias the fin plates and the spacer plates in a first biasing direction generally toward the electrical component to press the bottom edges of the fin plates and the spacer plates against the electrical component.

In another embodiment, a heat sink assembly is provided. The heat sink assembly includes a plate stack including fin plates and spacer plates arranged between the fin plates in a stacked arrangement. Each fin plate has a top edge and a bottom edge. Each fin plate has a first side between the top and bottom edges. Each fin plate has a second side opposite the first side between the top and bottom edges. Each spacer plate has a top edge and a bottom edge. Each spacer plate has a first side between the top and bottom edges. Each spacer plate has a second side opposite the first side between the top and bottom edges. The first and second sides of the spacer plates face the corresponding first and second sides of the fin plates. The bottom edges of the fin plates and the bottom edges of the spacer plates form a compliant thermal interface configured to interface with an electrical component. The upper edges of the fin plates are located above the upper edges of the spacer plates such that airflow channels are formed above the spacer plates between the fin plates. The heat sink assembly includes a support frame supporting the fin plates and the spacer plates in the plate stack. The support frame includes a first side panel at a first side of the plate stack and a second side panel at a second side of the plate stack. The support frame includes a spring support pin extending between the first side panel and the second side panel internally within the plate stack. The heat sink assembly includes a spring element extending internally within the plate stack. The spring element engages the spring support pin to locate the spring element relative to the support frame. The spring element engages the fin plates and the spacer plates to bias the fin plates and the spacer plates in a first biasing direction generally toward the electrical component to press the bottom edges of the fin plates and the spacer plates against the electrical component.

In a further embodiment, a communication system is provided. The communication system includes an electrical component having an upper surface. The electrical component has a thermal interface at the upper surface. The communication system includes a heat sink assembly thermally coupled to the thermal interface of the electrical component to dissipate heat from the electrical component. The heat sink assembly includes a plate stack including fin plates and spacer plates arranged between the fin plates in a stacked arrangement. Each fin plate has a top edge and a bottom edge. Each fin plate has a first side between the top and bottom edges. Each fin plate has a second side opposite the first side between the top and bottom edges. Each spacer plate has a top edge and a bottom edge. Each spacer plate has a first side between the top and bottom edges. Each spacer plate has a second side opposite the first side between the top and bottom edges. The first and second sides of the spacer plates face the corresponding first and second sides of the fin plates. The bottom edges of the fin plates and the bottom edges of the spacer plates face the upper surface of the electrical component and form a compliant thermal interface engaging the thermal interface of the electrical component. The upper edges of the fin plates are located above the upper edges of the spacer plates such that airflow channels are formed above the spacer plates between the fin plates. The heat sink assembly includes a support frame supporting the fin plates and the spacer plates in the plate stack. The support frame includes a spring support member extending internally within the plate stack. The heat sink assembly includes a spring element extending internally within the plate stack. The spring element engages the spring support member to locate the spring element relative to the support frame. The spring element engages the fin plates and the spacer plates to bias the fin plates and the spacer plates in a first biasing direction generally toward the electrical component to press the bottom edges of the fin plates and the spacer plates against the electrical component.

DETAILED DESCRIPTION OF THE INVENTION

Figure 1:
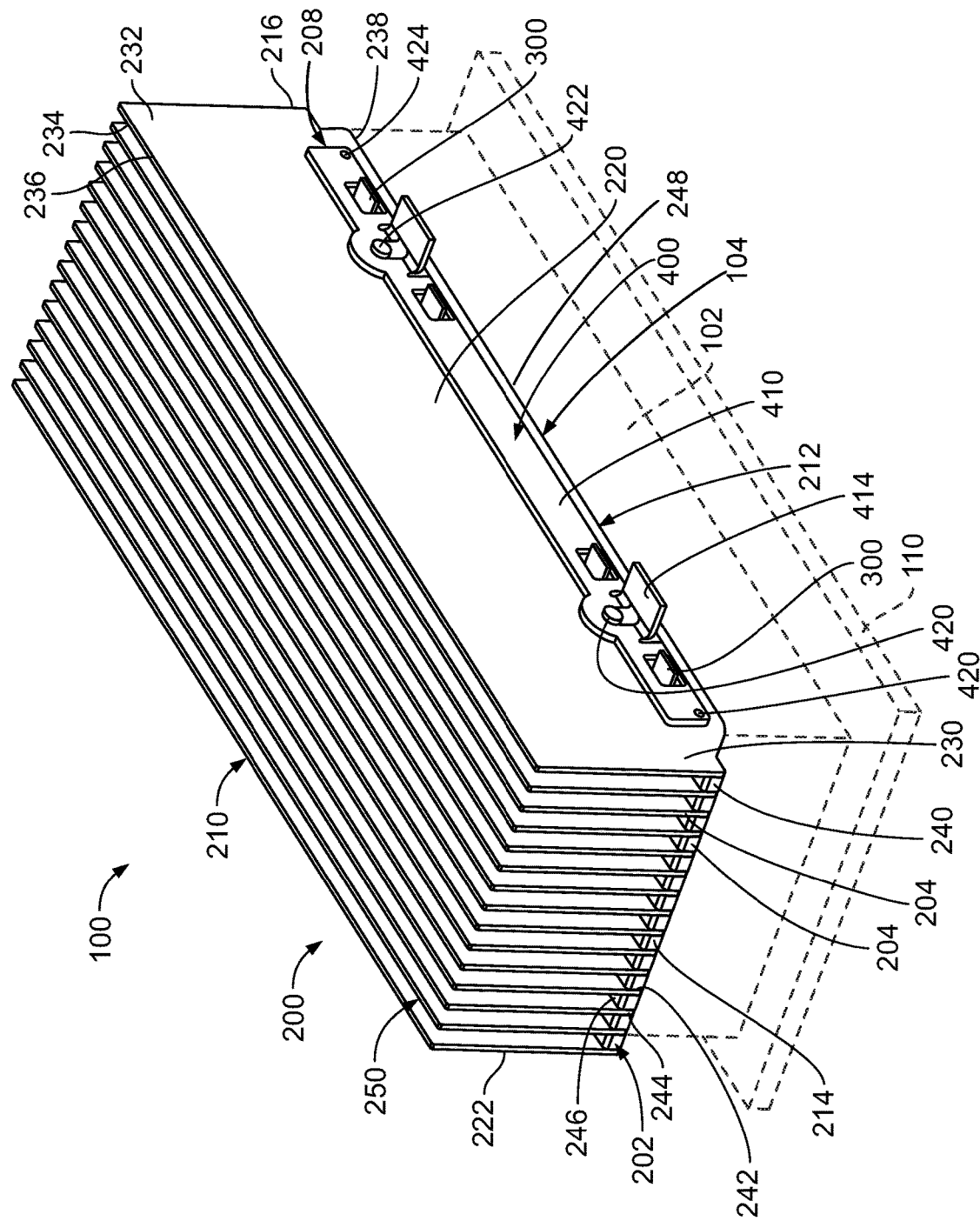
FIG. 1 is a front perspective view of a communication system and a heat sink assembly in accordance with an exemplary embodiment for dissipating heat from at least one electrical component of the communication system.

FIG. 1 is a front perspective view of a communication system 100 and a heat sink assembly 200 in accordance with an exemplary embodiment for dissipating heat from at least one electrical component 102 of the communication system 100. The heat sink assembly 200 is configured to be thermally coupled to the electrical component 102 at a thermal interface 104 at a bottom of the heat sink assembly 200. In an exemplary embodiment, the heat sink assembly 200 is air cooled by transferring heat to the passing airflow over a finned structure of the heat sink assembly 200.

The heat sink assembly 200 is compressible against the electrical component 102. In an exemplary embodiment, the heat sink assembly 200 is conformable to a shape of the electrical component 102 at the thermal interface 104 for efficient thermal transfer therebetween.

In an exemplary embodiment, the electrical component 102 is mounted to a circuit board 110. In various embodiments, the electrical component 102 may be a communication connector, such as a receptacle connector, a header connector, a plug connector, or another type of communication connector. In other various embodiments, the electrical component 102 may be an electronic package, such as an integrated circuit. In other various embodiments, the electrical component 102 may be a pluggable module, such as an I/O transceiver module. Other types of electrical components may be provided in alternative embodiments.

The heat sink assembly 200 includes a plate stack 202 having a plurality of independently movable plates 204, one or more spring elements 300 engaging the plates 204, and a support frame 400 for holding the plates 204 in the plate stack 202. The plates 204 are configured to thermally engage the electrical component 102 and dissipate heat away from the electrical component 102 to cool the electrical component 102. The plates 204 are configured to dissipate heat into the external environment. Any number of the spring elements 300 may be provided, such as a pair of the spring elements 300 defining a front spring element and a rear spring element. Greater or fewer spring elements 300 may be provided in alternative embodiments. The spring elements 300 bias the plates 204 in a first biasing direction, such as a downward biasing direction, toward the electrical component 102. The plates 204 are internested with each other and sandwiched together in the plate stack 202 for thermal communication between the plates 204. The individual plates 204 are movable relative to each other such that the plates 204 may be individually articulated to conform to the electrical component 102 for improved contact and/or proximity between the heat sink assembly 200 and the electrical component 102. For example, the plates 204 may be deflectable and movable within the support frame 400 when the heat sink assembly 200 is coupled to the electrical component 102.

In an exemplary embodiment, the heat sink assembly 200 is parallelepiped (for example, generally box shaped). For example, the heat sink assembly 200 includes a top 210, a bottom 212, a front 214, a rear 216, a first side 220, and a second side 222. The top 210 may be generally planar. The bottom 212 may be generally planar. The front 214 may be generally planar. The rear 216 may be generally planar. The first side 220 may be generally planar. The second side 222 may be generally planar. However, the heat sink assembly 200 may have other shapes in alternative embodiments. The support frame 400 is used to hold the heat sink assembly 200 together. In an exemplary embodiment, the support frame 400 provides external support for the plate stack 202 and provides internal support for the plate stack 202. For example, as in the illustrated embodiment, the support frame 400 may extend along the first side 220 and the second side 222. The support frame 400 may additionally or alternatively extend along the front 214 and/or the rear 216. The support frame 400 may additionally or alternatively extend along the top 210 and/or the bottom 212. The support frame 400 passes through an interior of the plate stack 202, such as between the first side 220 and the second side 222, to hold the plate stack 202 together.

In an exemplary embodiment, the plates 204 of the plate stack 202 includes fin plates 230 and spacer plates 240 between the fin plates 230. Each fin plate 230 has opposite first and second sides 232, 234. The fin plate 230 extends between a top edge 236 and a bottom edge 238. The bottom edge 238 faces the electronic component 102 and interfaces with the thermal interface 104 of the electronic component 102. The fin plate 230 has a height between the top edge 236 and the bottom edge 238. Optionally, various fin plates 230 may have different shapes, such as different heights and/or different widths.

Each spacer plate 240 has opposite first and second sides 242, 244. The spacer plate 240 extends between a top edge 246 and a bottom edge 248. The bottom edge 248 faces the electronic component 102 and interfaces with the thermal interface 104 of the electronic component 102. Optionally, the bottom edges 248 of the spacer plates 240 are generally aligned with the bottom edges 238 of the fin plates 230 to form the thermal interface. Each spacer plate 240 has a height between the top edge 246 and the bottom edge 248, which is considerably shorter than the height of the fin plates 230. For example, the fin plates 230 extend vertically above the spacer plates 240 to form airflow channels 250 between the fin plates 230. The airflow channels 250 are located above the spacer plates 240. The airflow channels 250 allow airflow between the fin plates 230, such as along the sides 232, 234 of the fin plates 230 to dissipate heat into the surrounding airflow. Widths of the spacer plates 240 control the widths of the airflow channels 250. Optionally, various spacer plates 240 may have different shapes, such as different heights and/or different widths.

In an exemplary embodiment, the support frame 400 includes a first side panel 410 at the first side 220 of the plate stack 202 and a second side panel 412 (shown in FIG. 3) at the second side 222 of the plate stack 202. Optionally, end panels (not shown) may extend between the side panels 410, 412 to form a rectangular frame structure for the plate stack 202. In an exemplary embodiment, the side panels 410 include mounting tabs 414 configured to be mounted to a support structure (not shown), such as a chassis, a cage, a socket frame, or another supporting structure. The mounting tabs 414 may be welded to the support structure. The mounting tabs 414 fix the support frame 400 relative to the supporting structure. The plates 204 may be movable relative to the support frame 400, and thus the supporting structure.

The support frame 400 includes cross members 420 extending between the first and second side panels 410, 412. The cross members 420 may be used to support the first side panel 410 relative to the second side panel 412 (for example, to maintain the spacing between the side panels 410, 412). The cross members 420 are used to support the spring element 300 relative to the support frame 400. For example, the cross members 420 may be located immediately above the spring element 300 to hold a position of the spring element 300 within the plate stack 202. The spring element 300 may press upward against the cross members 420 such that the cross members 420 form a bearing surface for the spring element 300 to press against. The cross members 420 may be used to hold relative positions of the plates 204 within the plate stack 202 (for example, may be used to hold front-to-rear positions and/or side-to-side positions and/or top-to-bottom positions). In various embodiments, the plates 204 may have a limited amount of floating movement relative to the cross members 420 (for example, a controlled among of movement front-to-rear and/or side-to-side and/or top-to-bottom). In various embodiments, the cross members 420 are internal cross members extending internally within the plate stack 202. For example, the cross members 420 may pass through the fin plates 230 and/or the spacer plates 240. Additionally or alternatively, the cross members 420 may include external cross members extending around the exterior of the plate stack 202. For example, the external cross members may be walls or panels that engage the exterior surfaces of the plates 204. The external cross members may be provided at the front 214 and/or the rear 216 (for example, forming a rectangular frame structure with the side panels 410, 412).

In the illustrated embodiment, the cross members 420 include spring support elements 422 and plate support elements 424. The spring support elements 422 support the spring elements 300 and the plate support elements 424 support the plates 204 relative to each other and relative to the support frame 400. In the illustrated embodiment, the plate support elements 424 are cylindrical pins. However, other types of support elements may be used in alternative embodiments. In the illustrated embodiment, the spring support elements 422 are cylindrical pins and may be referred to hereinafter as spring support pins 422. The spring support elements 422 and/or the plate support elements 424 may be structures other than pins, such as rails, pegs, tabs, or other structures. Any number of the spring support pins 422 may be provided, such as a pair of the spring support pins 422 defining a front spring support pin proximate to the front 214 and a rear spring support pin proximate to the rear 216. Ends of the spring support elements 422 may be secured to the side panels 410, 412. For example, the ends of the spring support pins 422 may be soldered, welded, flattened, riveted, threadably coupled, or otherwise coupled to the side panels 410, 412. Any number of the plate support elements 424 may be provided, such as a pair of the plate support elements 424 defining front plate support pins proximate to the front 214 and rear plate support pins proximate to the rear 216. The plate support elements 424 may be cylindrical pins in various embodiments. Ends of the plate support elements 424 may be secured to the side panels 410, 412. For example, the ends of the plate support elements 424 may be soldered, welded, flattened, riveted, threadably coupled, or otherwise coupled to the side panels 410, 412.

Figure 2:
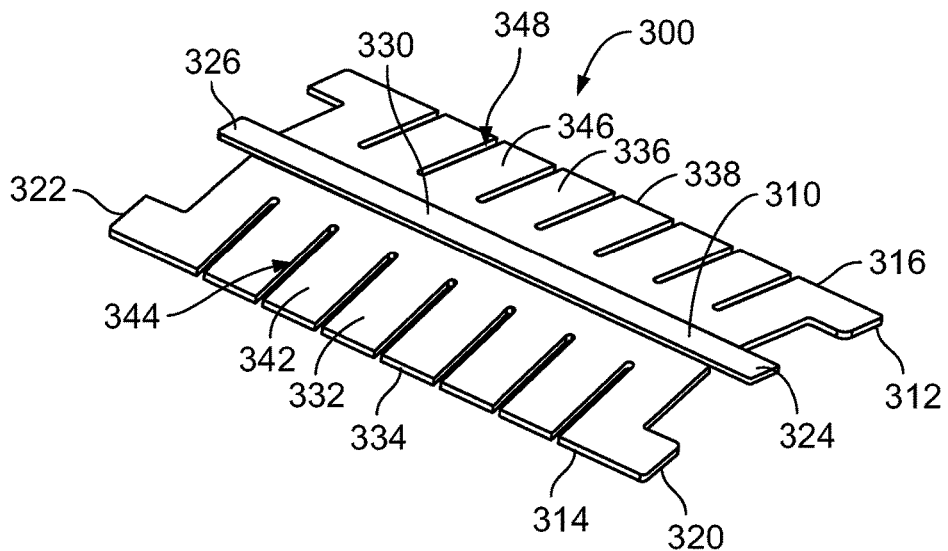
FIG. 2 is a perspective view of the spring element in accordance with an exemplary embodiment.

FIG. 2 is a perspective view of the spring element 300 in accordance with an exemplary embodiment. The spring element 300 includes a top 310, a bottom 312, a front 314, a rear 316, a first side 320, and a second side 322. The spring element 300 includes mounting tabs 324, 326 at the first and second sides 320, 322, respectively, for mounting the spring element 300 to the support frame 400 (shown in FIG. 1). In an exemplary embodiment, the spring element 300 is a stamped and formed structure being stamped from a metal sheet into a spring shape. The spring element 300 may be a cupped leaf spring in various embodiments; however the spring element 300 may have other shapes in alternative embodiments. The spring element 300 is manufactured from a thin metal material such that the spring element 300 is flexible.

The spring element 300 includes a center body 330 extending between the first and second sides 320, 322. A front wing 332 extends forwardly from the center body 330 at a downward angle to a front edge 334 at the front 314 of the spring element 300. A rear wing 336 extends rearwardly from the center body 330 at a downward angle to a rear edge 338 at the rear 316 of the spring element 300. The center body 330 is provided at the top 310 of the spring element 300. The front and rear edges 334, 338 are provided at the bottom 312 of the spring element 300 to engage the plates 204 of the heat sink assembly 200 (shown in FIG. 1) to press the plates 204 in the downward biasing direction.

In an exemplary embodiment, the front wing 332 is segmented into a plurality of front spring fingers 342. The front spring fingers 342 are separated by gaps 344 formed by cutting the front wing 332 inward from the front edge 334, such as during the stamping process. The front spring fingers 342 are independently movable relative to each other, such as to provide independent spring pressure to the corresponding plates 204. In an exemplary embodiment, the rear wing 336 is segmented into a plurality of rear spring fingers 346. The rear spring fingers 346 are separated by gaps 348 formed by cutting the rear wing 336 inward from the rear edge 338, such as during the stamping process. The rear spring fingers 346 are independently movable relative to each other, such as to provide independent spring pressure to the corresponding plates 204.

Figure 3:
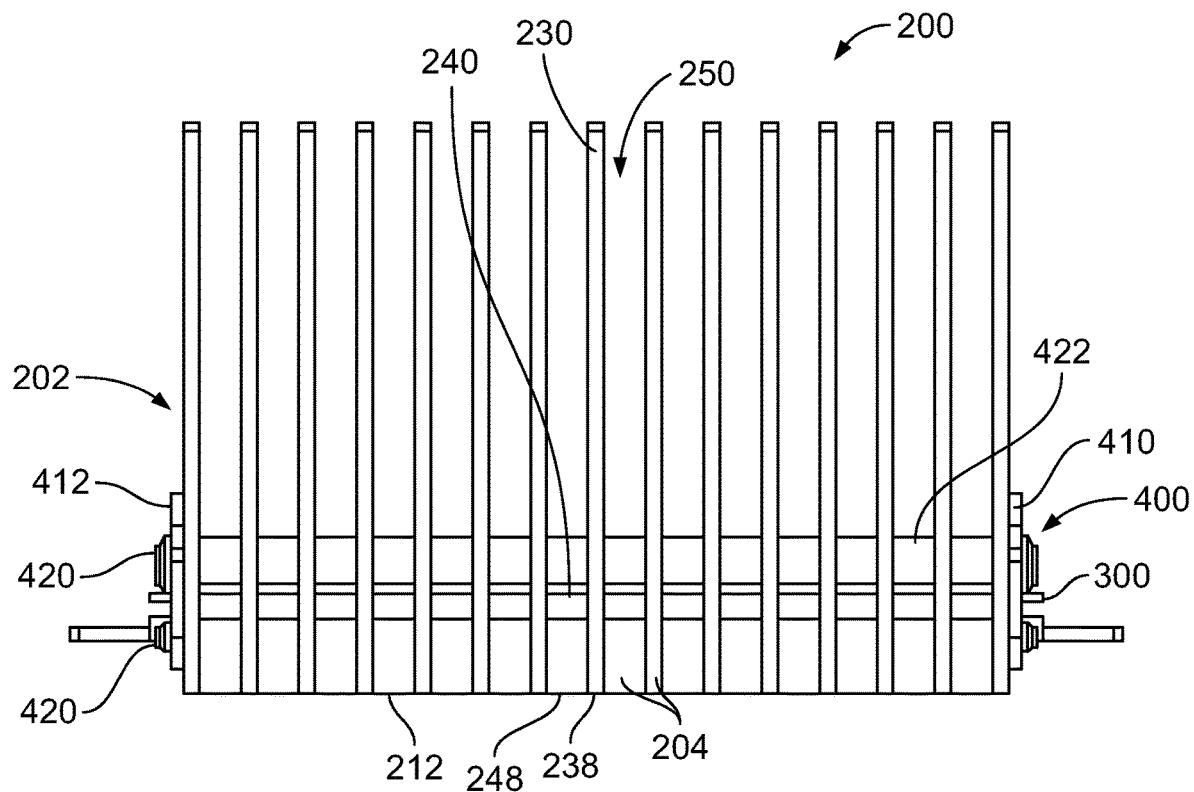
FIG. 3 is a front view of the heat sink assembly in accordance with an exemplary embodiment.

FIG. 3 is a front view of the heat sink assembly 200 in accordance with an exemplary embodiment. The heat sink assembly 200 includes the plates 204 arranged in the plate stack 202. The support frame 400 is configured to hold the plates 204 in the plate stack 202. The spring element 300 is supported by the support frame 400 and acts on the plates 204 to press the plates 204 in the downward biasing direction.

The fin plates 230 are located between the spacer plates 240. The bottom edges 238 of the fin plates 230 and the bottom edges 248 of the spacer plates 240 define the bottom 212 of the heat sink assembly 200 defining the thermal interface with the electrical component 102 (shown in FIG. 1). The fin plates 230 and the spacer plates 240 are both configured to be directly thermally coupled to the electrical component 102 at the bottom 212. The fin plates 230 are taller than the spacer plates 240 and extend above the top edges 246 of the spacer plates 240. The airflow channels 250 are located between the fin plates 230 and located above the spacer plates 240. The spacer plates 240 hold the relative positions of the fin plates 230 to define the airflow channels 250 therebetween. When assembled, the side panels 410, 412 hold the fin plates 230 and the spacer plates 240 in the plate stack 202 and the cross members 420 hold the relative positions of the side panels 410, 412. In an exemplary embodiment, the spring support pin 422 extends across the top of the spring element 300 and above the spacer plates 240.

Figure 4:
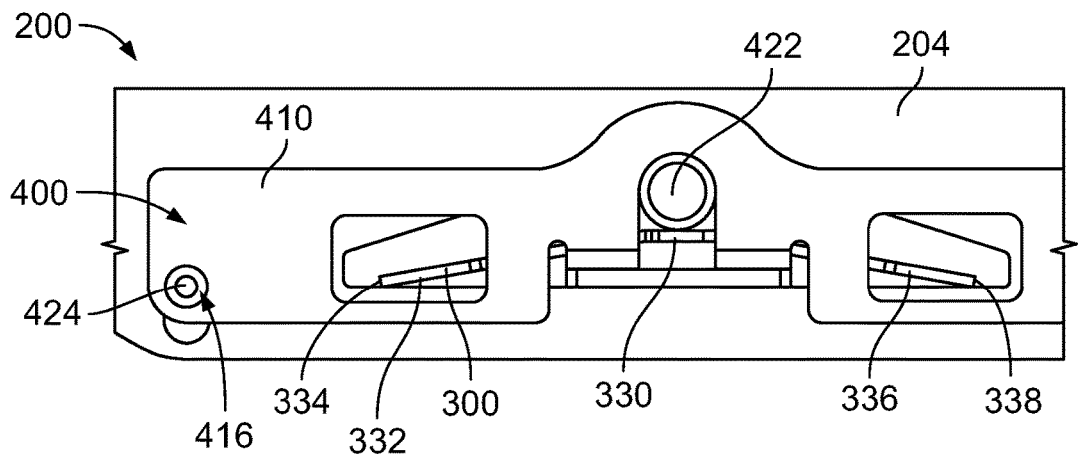
FIG. 4 is a side view of a portion of the heat sink assembly showing the support frame in accordance with an exemplary embodiment showing the first side panel.
Figure 5:
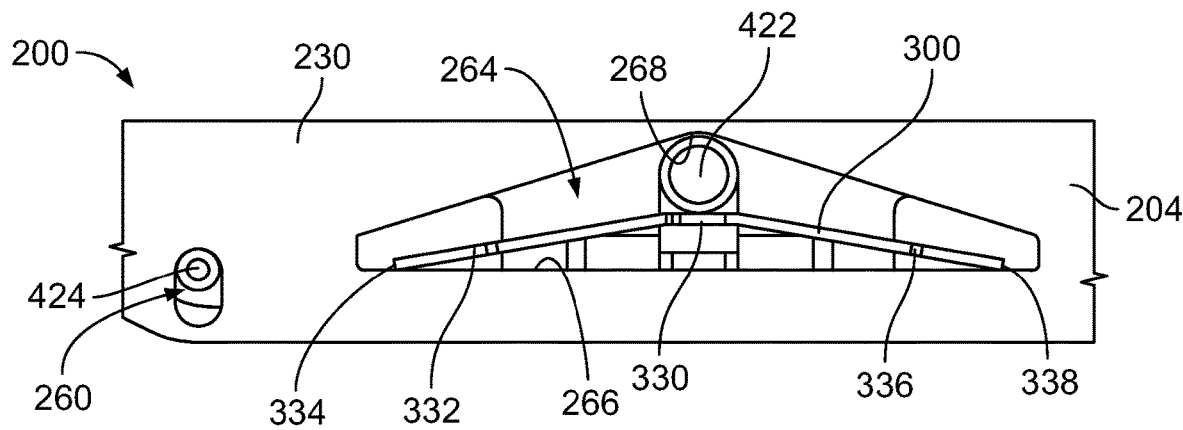
FIG. 5 is a side view of a portion of the heat sink assembly showing the support frame in accordance with an exemplary embodiment showing the fin plate.
Figure 6:
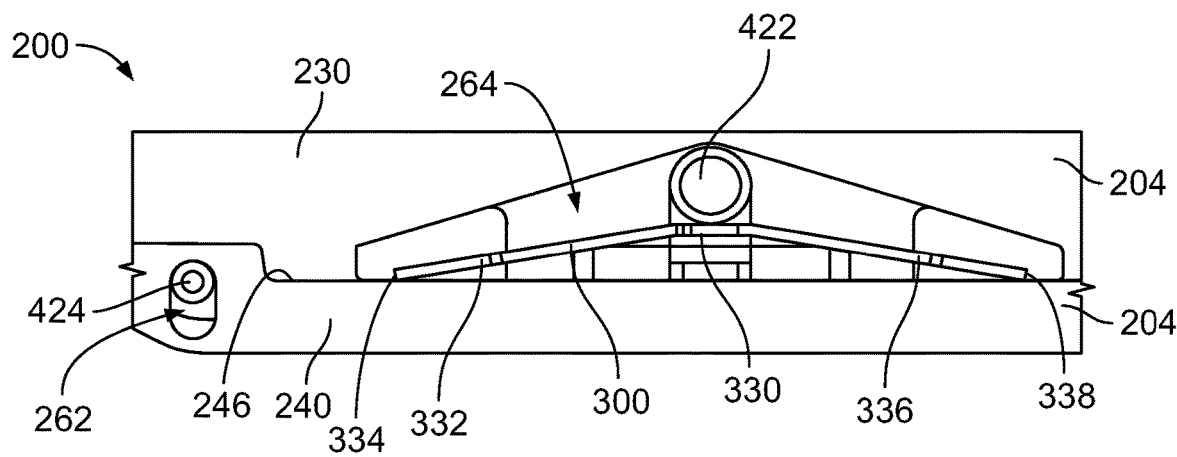
FIG. 6 is a side view of a portion of the heat sink assembly showing the support frame in accordance with an exemplary embodiment showing the spacer plate.

FIG. 4 is a side view of a portion of the heat sink assembly 200 showing the support frame 400 in accordance with an exemplary embodiment showing the first side panel 410. FIG. 5 is a side view of a portion of the heat sink assembly 200 showing the support frame 400 in accordance with an exemplary embodiment showing the fin plate 230. FIG. 6 is a side view of a portion of the heat sink assembly 200 showing the support frame 400 in accordance with an exemplary embodiment showing the spacer plate 240. FIGS. 4-6 illustrate the support frame 400 relative to the plates 204 and the spring element 300.

The support frame 400 is used to support the plates 204 and is used to support the spring element 300 relative to the plates 204. The plate support pin 424 extends through the side panel 410 (FIG. 4), the fin plate 230 (FIG. 5), and the spacer plate 240 (FIG. 6). The side panel 410 includes an opening 416 that receives the plate support pin 424. The fin plate 230 includes a fin plate slot 260 (FIG. 5) and the spacer plate 240 includes a spacer plate slot 262 (FIG. 6). The plate support elements 424 extend internally through the fin plates 230 in the fin plate slots 260 and the plate support elements 424 extend internally through the spacer plates 240 in the spacer plate slots 262. In an exemplary embodiment, the fin plate slots 260 are elongated (for example, in a vertical direction) and the spacer plate slots 262 are elongated (for example in a vertical direction). The fin plates 230 and the spacer plates 240 are movable relative to the plate support elements 424. The fin plate slots 260 and the spacer plate slots 262 provide relief relative to the plate support elements 424 to allow the fin plates 230 and the spacer plates 240 to move relative to the plate support elements 424. For example, the fin plates 230 and the spacer plates 240 may move upward relative to the plate support element 424.

The fin plate 230 includes a spring opening 264 (FIG. 5) that receives the spring element 300. In the illustrated embodiment, the spring opening 264 is triangular shaped having a flat bottom 266 and a peak 268 at a top of the spring opening 264. The peak 268 may be approximately centered between a front and a rear of the spring opening 264. The spring support pin 422 is received in the spring opening 264 at the peak 268 and positioned in the spring opening 264 by the walls of the fin plate 230 forming the spring opening 264 extending from the peak 268. The center body 330 is aligned with the peak 268. The spring support pin 422 is aligned with the center body 330 and supports the spring element 300. The spring element 300 presses against the spring support pin 422. The front and rear wings 332, 336 extend from the center body 330 such that the front and rear edges 334, 338 engage the bottom 266 of the spring opening 264 to press against the fin plate 230 and engage the top edge 246 of the spacer plate 240 (FIG. 6). The spring element 300 biases the fin plate 230 and the spacer plate 240 in the downward biasing direction to engage the electrical component 102 (shown in FIG. 1).

Figure 7:
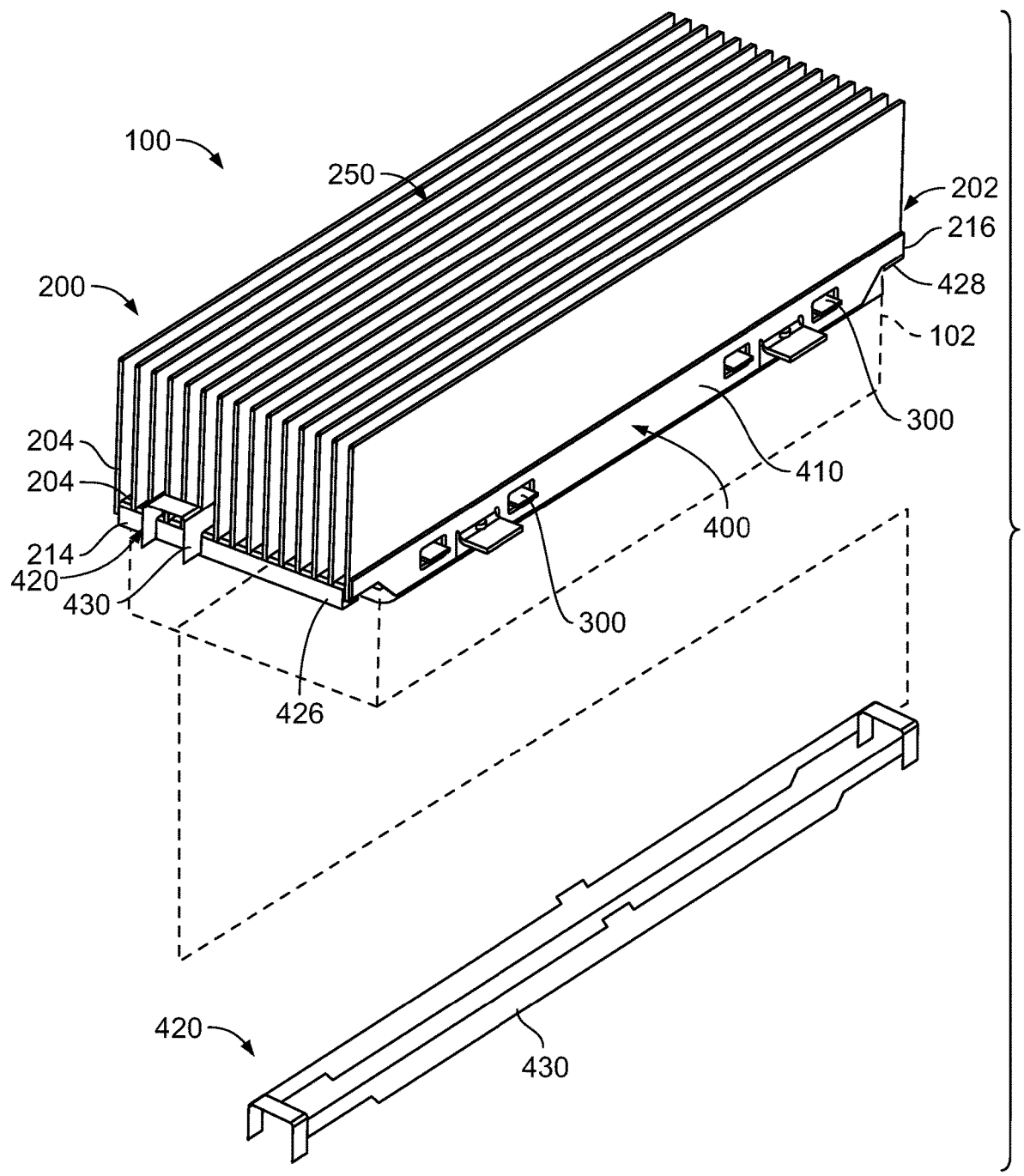
FIG. 7 is a front perspective view of the communication system and the heat sink assembly in accordance with an exemplary embodiment for dissipating heat from at least one electrical component of the communication system.

FIG. 7 is a front perspective view of the communication system 100 and the heat sink assembly 200 in accordance with an exemplary embodiment for dissipating heat from at least one electrical component 102 of the communication system 100. The support frame 400 includes different features than the embodiment illustrated in FIG. 1. The plates 204 of the heat sink assembly 200 may be shaped differently to interface with the features of the support frame 400.

The support frame 400 holds the plates 204 in the plate stack 202. The support frame 400 supports the spring elements 300. The spring elements 300 bias the plates 204 in the first biasing direction, such as the downward biasing direction. The individual plates 204 are movable relative to each other and relative to the support frame 400 such that the plates 204 may be individually articulated to conform to the electrical component 102 (shown in FIG. 1) for improved contact and/or proximity between the heat sink assembly 200 and the electrical component 102.

Figure 8:
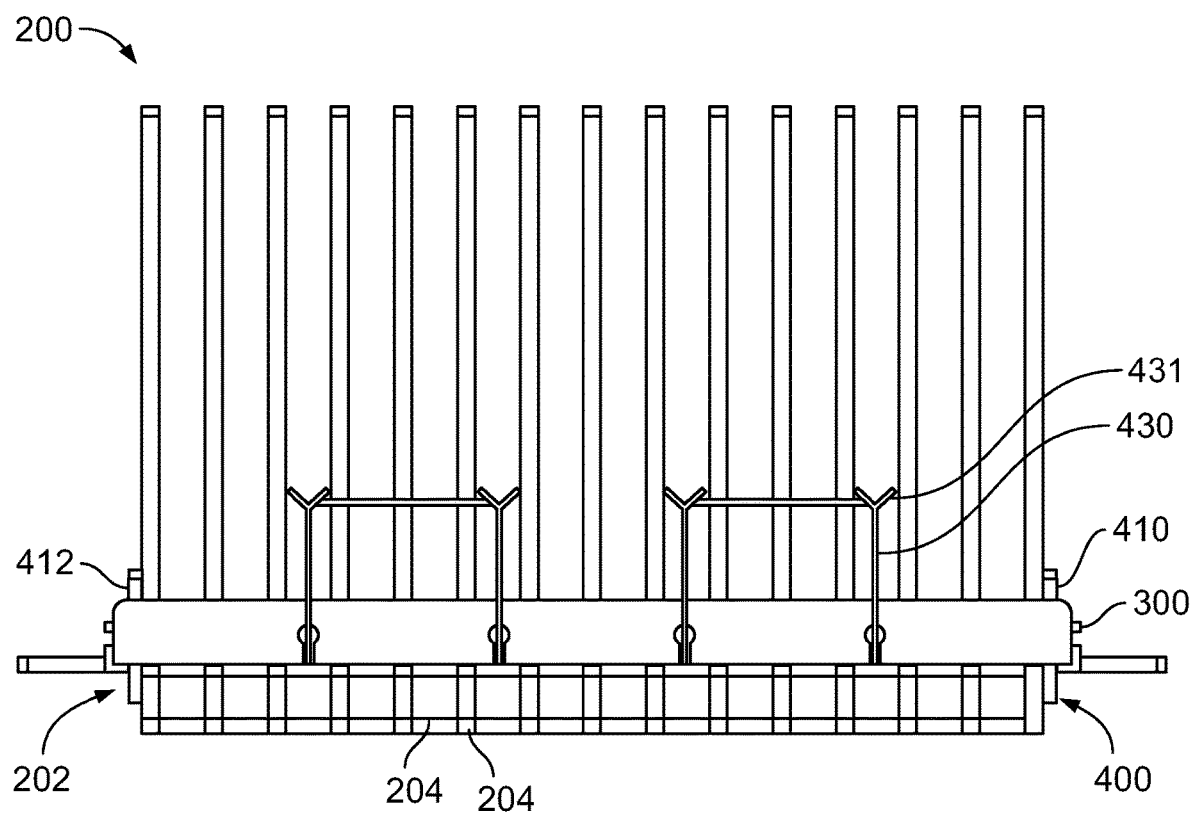
FIG. 8 is a front view of the heat sink assembly in accordance with an exemplary embodiment.

The support frame 400 includes the first side panel 410 and the second side panel 412 (shown in FIG. 8). The support frame 400 includes the cross members 420 extending between the first and second side panels 410, 412. The cross members 420 support the first side panel 410 relative to the second side panel 412 (for example, to maintain the spacing between the side panels 410, 412). In an exemplary embodiment, the cross members 420 are external cross members located exterior of the plate stack 202. For example, the cross members 420 include a front end panel 426 at the front 214 and a rear end panel 428 at the rear 216. The end panels 426, 428 extend between the side panels 410, 412 and hold the side panels 410, 412 relative to each other.

The end panels 426, 428 form plate support elements for the ends of the plates 204. The end panels 426, 428 and the side panels 410, 412 form a rectangular outer frame for the plate stack 202. The support frame 400 includes cross members extending across the plate stack 202 between the end panels 426, 428. For example, the cross members extend front to rear.

In an exemplary embodiment, the support frame 400 includes spring support rails 430 extending through the airflow channels 250 along a top of the spring elements 300. The spring support rails 430 may extend parallel to the plates 204. The spring support rails 430 define spring support elements for the spring elements 300. The spring support rails 430 are supported by the end panels 426, 428 at the front 214 of the plate stack 202 and the rear 216 of the plate stack 202. The spring support rails 430 are used to support the spring elements 300 relative to the support frame 400. The spring elements 300 press upward against the spring support rails 430 such that the spring support rails 430 form a bearing surface for the spring element 300 to press against.

FIG. 8 is a front view of the heat sink assembly 200 in accordance with an exemplary embodiment. The heat sink assembly 200 includes the plates 204 arranged in the plate stack 202. The support frame 400 is configured to hold the plates 204 in the plate stack 202. The spring element 300 is supported by the support frame 400 and acts on the plates 204 to press the plates 204 in the downward biasing direction. For example, the spring support rails 430 span across the tops of the spring elements 300 to hold the spring elements 300 in position relative to the plates 204. In an exemplary embodiment, the spring support rails 430 include locating tabs 431 engaging the plates 204 to locate the spring support rails 430 relative to the plates 204. For example, the locating tabs 431 may extend in two directions to engage adjacent plates 204.

Figure 9:
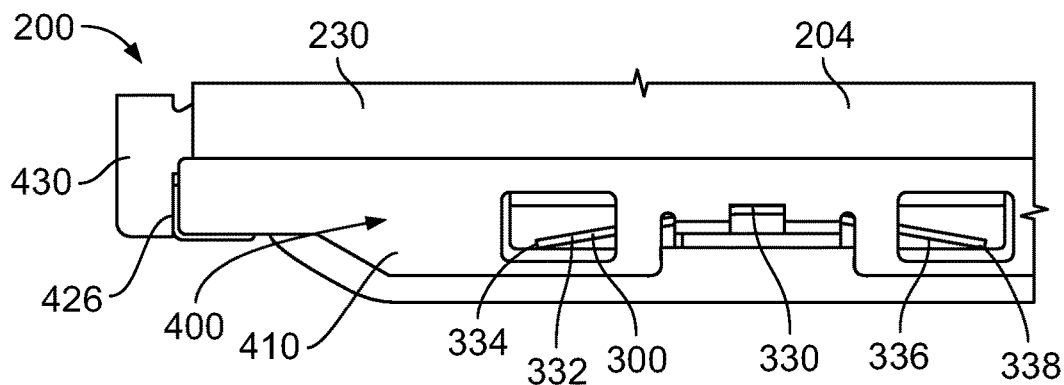
FIG. 9 is a side view of a portion of the heat sink assembly showing the support frame in accordance with an exemplary embodiment showing the first side panel.
Figure 10:
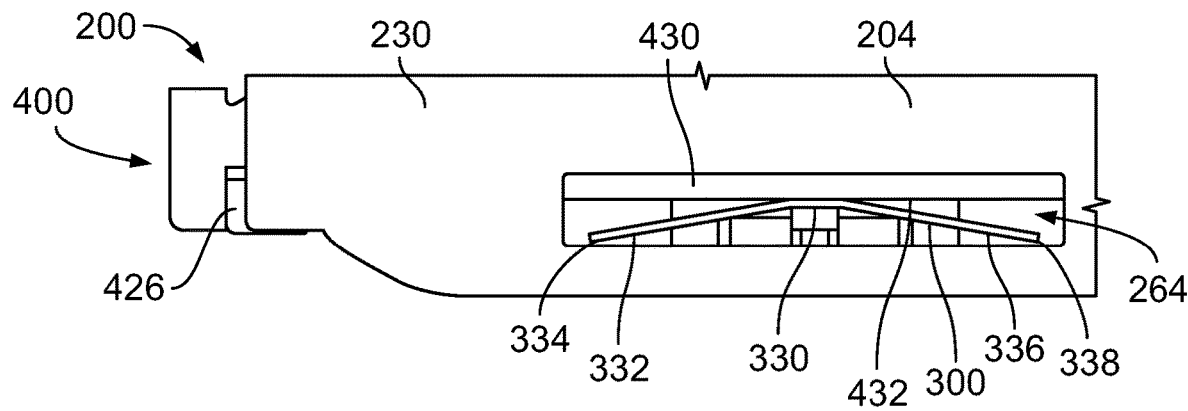
FIG. 10 is a side view of a portion of the heat sink assembly showing the support frame in accordance with an exemplary embodiment showing the fin plate.
Figure 11:
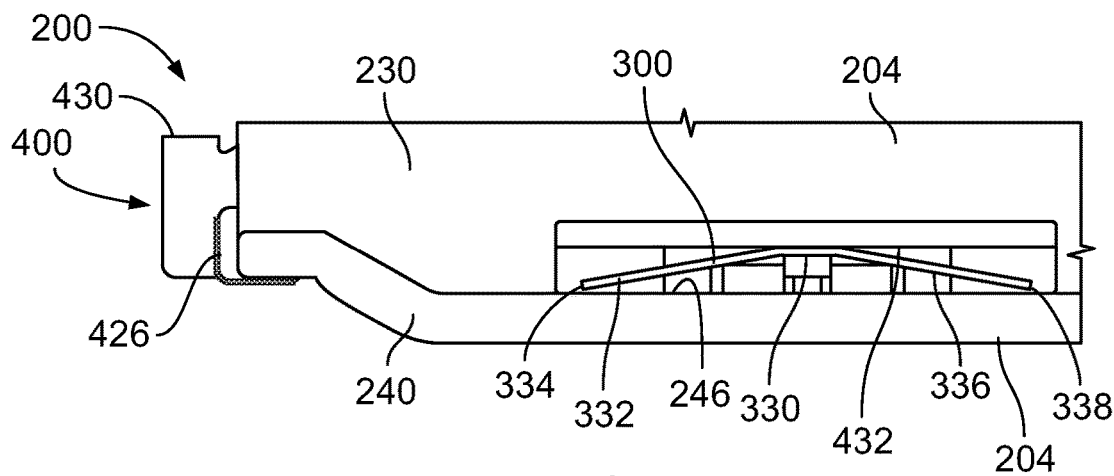
FIG. 11 is a side view of a portion of the heat sink assembly showing the support frame in accordance with an exemplary embodiment showing the spacer plate.

FIG. 9 is a side view of a portion of the heat sink assembly 200 showing the support frame 400 in accordance with an exemplary embodiment showing the first side panel 410. FIG. 10 is a side view of a portion of the heat sink assembly 200 showing the support frame 400 in accordance with an exemplary embodiment showing the fin plate 230. FIG. 11 is a side view of a portion of the heat sink assembly 200 showing the support frame 400 in accordance with an exemplary embodiment showing the spacer plate 240. FIGS. 9-11 illustrate the support frame 400 relative to the plates 204 and the spring element 300.

The support frame 400 is used to support the plates 204 and is used to support the spring element 300 relative to the plates 204. The end panel 426 is coupled to the side panel 410 (FIG. 9). The spring support rails 430 extends along the fin plate 230 (FIG. 10) and the spacer plate 240 (FIG. 11). The spring support rail 430 is coupled to the end panel 426, such as being welded to the end panel 426. The spring opening 264 (FIG. 10) of the fin plate 230 receives the spring element 300. In the illustrated embodiment, the spring opening 264 is rectangular shaped having a flat bottom and a flat top. The spring support rail 430 has a bottom edge 432 that engages the center body 330. The bottom edge 432 may be located below the top of the spring opening 264 to support the spring element 300. The front and rear wings 332, 336 extend from the center body 330 such that the front and rear edges 334, 338 engage the bottom of the spring opening 264 to press against the fin plate 230 and engage the top edge 246 of the spacer plate 240 (FIG. 11). The spring element 300 biases the fin plate 230 and the spacer plate 240 in the downward biasing direction to engage the electrical component 102 (shown in FIG. 1).

Figure 12:
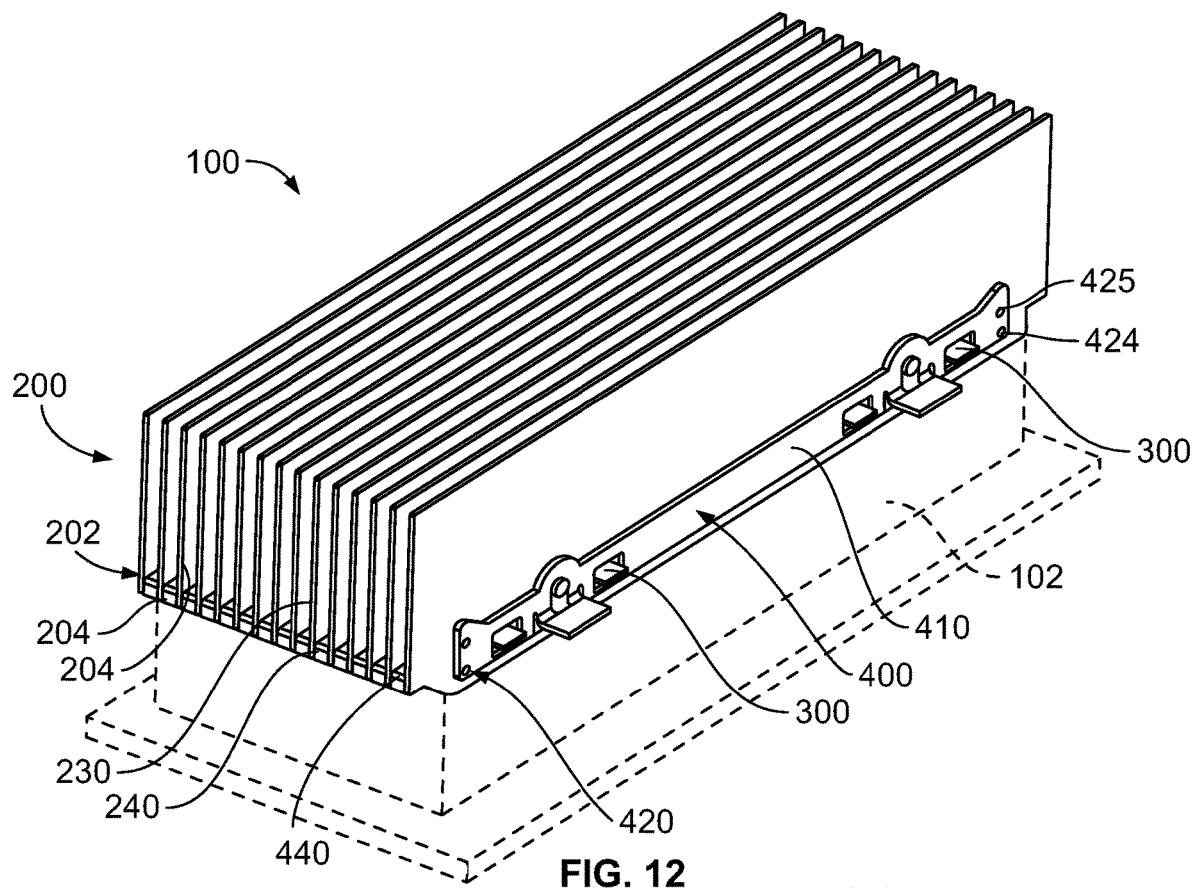
FIG. 12 is a front perspective view of the communication system and the heat sink assembly in accordance with an exemplary embodiment for dissipating heat from at least one electrical component of the communication system.

FIG. 12 is a front perspective view of the communication system 100 and the heat sink assembly 200 in accordance with an exemplary embodiment for dissipating heat from at least one electrical component 102 of the communication system 100. The support frame 400 includes different features than the embodiment illustrated in FIG. 1 or the embodiment illustrated in FIG. 7. The plates 204 of the heat sink assembly 200 may be shaped differently to interface with the features of the support frame 400.

The support frame 400 holds the plates 204 in the plate stack 202. In an exemplary embodiment, the support frame 400 includes upper spacer plates 440 between the fin plates 230. The upper spacer plates 440 are used to support the spring elements 300. The upper spacer plates 440 are internal support elements located interior of the plate stack 202. The spring elements 300 bias the plates 204 in the first biasing direction, such as the downward biasing direction. The individual plates 204 are movable relative to each other and relative to the support frame 400 such that the plates 204 may be individually articulated to conform to the electrical component 102 (shown in FIG. 1) for improved contact and/or proximity between the heat sink assembly 200 and the electrical component 102.

Figure 13:
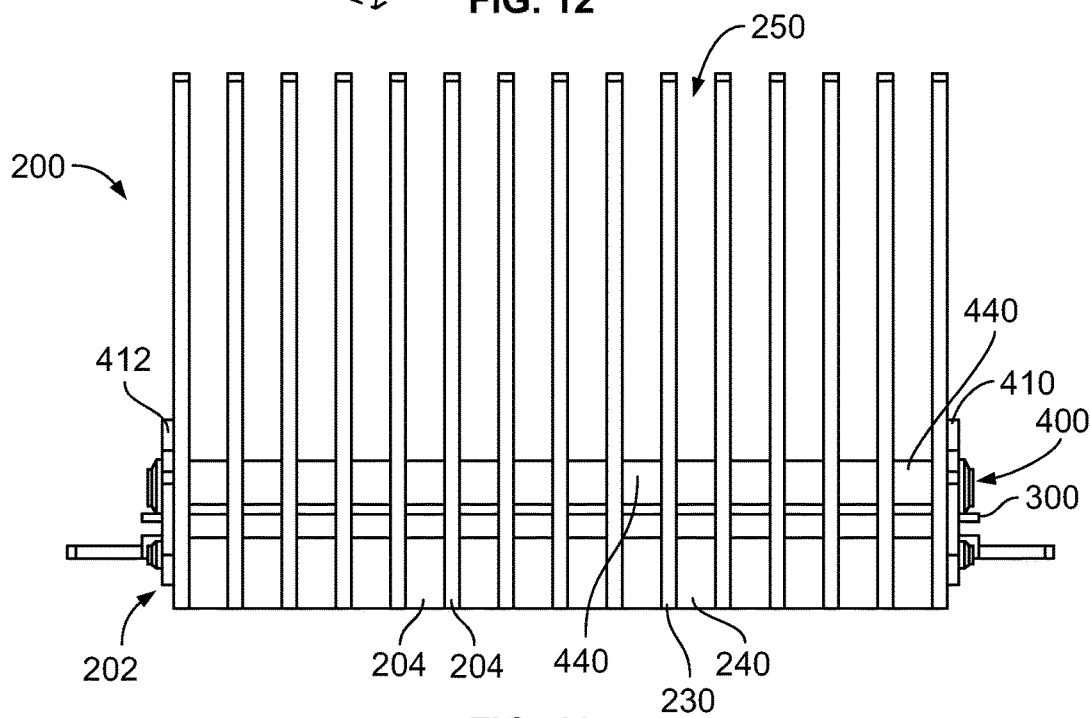
FIG. 13 is a front view of the heat sink assembly in accordance with an exemplary embodiment.

The support frame 400 includes the first side panel 410 and the second side panel 412 (shown in FIG. 13). The support frame 400 includes the cross members 420 extending between the first and second side panels 410, 412. The cross members 420 support the first side panel 410 relative to the second side panel 412 (for example, to maintain the spacing between the side panels 410, 412). In an exemplary embodiment, the cross members 420 include the plate support elements 424 and upper plate support elements 425. The upper plate support elements 425 are plate support pins similar to the plate support elements 424. The lower plate support elements 424 support the fin plates 230 and the spacer plates 240. The upper plate support elements 425 support the fin plates 230 and the upper spacer plates 440.

FIG. 13 is a front view of the heat sink assembly 200 in accordance with an exemplary embodiment. The heat sink assembly 200 includes the plates 204 arranged in the plate stack 202. The support frame 400 is configured to hold the plates 204 in the plate stack 202. The support frame 400 includes the upper spacer plates 440, which are located in the airflow channels 250 between the fin plates 230. The upper spacer plates 440 are located above the spacer plates 240. The spring element 300 is supported by the upper spacer plates 440 of the support frame 400 and acts on the plates 204 to press the plates 204 in the downward biasing direction. For example, the upper spacer plates 440 span across the tops of the spring elements 300 to hold the spring elements 300 in position relative to the plates 204.

Figure 14:
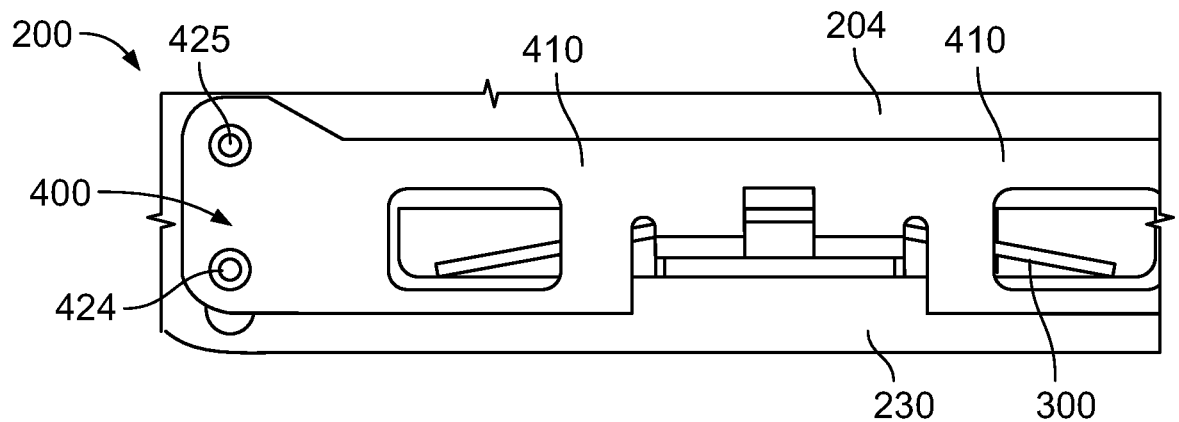
FIG. 14 is a side view of a portion of the heat sink assembly showing the support frame in accordance with an exemplary embodiment showing the first side panel.
Figure 15:
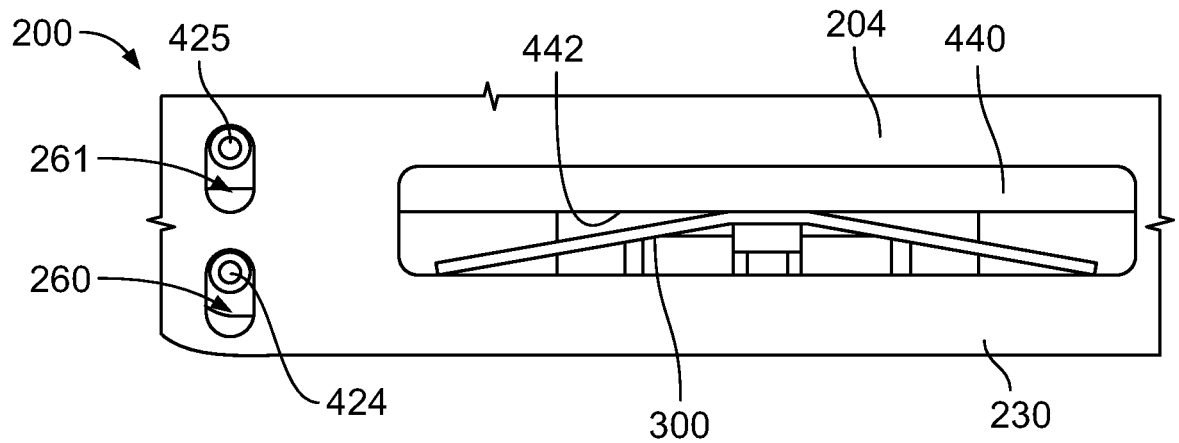
FIG. 15 is a side view of a portion of the heat sink assembly showing the support frame in accordance with an exemplary embodiment showing the fin plate.
Figure 16:
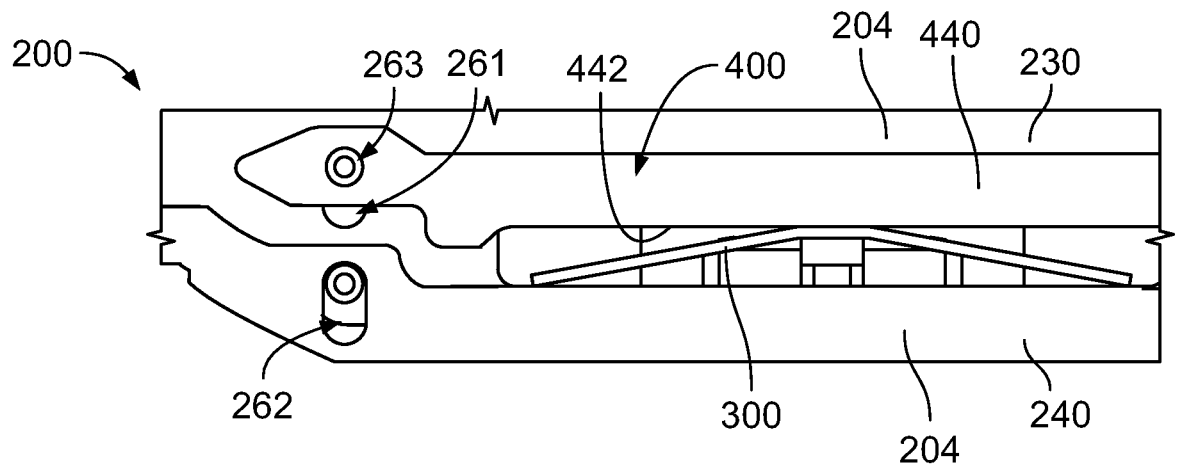
FIG. 16 is a side view of a portion of the heat sink assembly showing the support frame in accordance with an exemplary embodiment showing the spacer plate.

FIG. 14 is a side view of a portion of the heat sink assembly 200 showing the support frame 400 in accordance with an exemplary embodiment showing the first side panel 410. FIG. 15 is a side view of a portion of the heat sink assembly 200 showing the support frame 400 in accordance with an exemplary embodiment showing the fin plate 230. FIG. 16 is a side view of a portion of the heat sink assembly 200 showing the support frame 400 in accordance with an exemplary embodiment showing the spacer plate 240. FIGS. 14-16 illustrate the support frame 400 relative to the plates 204 and the spring element 300.

The support frame 400 is used to support the plates 204 and is used to support the spring element 300 relative to the plates 204. The plate support elements 424, 425 extend through the side panel 410 (FIG. 14). The plate support element 424 supports the fin plates 230 (FIG. 15) and the spacer plates 240 (FIG. 16) and the upper plate support element 425 supports the fin plates 230 (FIG. 15) and the upper spacer plates 440 (FIG. 16). In an exemplary embodiment, the fin plate 230 includes the fin plate slot 260 (FIG. 15) and an upper fin plate slot 261. The spacer plate 240 includes the spacer plate slot 262 (FIG. 16). The upper spacer plate 440 includes an upper spacer plate hole 263. The plate support elements 424 extend internally through the fin plates 230 in the fin plate slots 260 and the plate support elements 424 extend internally through the spacer plates 240 in the spacer plate slots 262. The upper plate support elements 425 extend internally through the fin plates 230 in the upper fin plate slots 261 and the upper plate support elements 425 extend internally through the upper spacer plates 440 in the upper spacer plate holes 263. The fin plates 230 and the spacer plates 240 are movable relative to the plate support elements 424 and the upper spacer plates 440.

The upper spacer plates 440 support the spring element 300. The upper spacer plates 440 are held in place in the plate stack 202 by the upper plate support elements 425. The upper spacer plates 440 include a bottom edge 442 that forms a support surface for the spring element 300. The fin plates 230 are movable in an upward direction relative to the upper spacer plates 440 when the heat sink assembly 200 is coupled to the electrical component 102. The spacer plates 240 are movable in an upward direction toward the upper spacer plates 440 when the heat sink assembly 200 is coupled to the electrical component 102.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A heat sink assembly comprising:
a plate stack including fin plates and spacer plates arranged between the fin plates in a stacked arrangement, each fin plate having a top edge and a bottom edge, each fin plate having a first side between the top and bottom edges, each fin plate having a second side opposite the first side between the top and bottom edges, each spacer plate having a top edge and a bottom edge, each spacer plate having a first side between the top and bottom edges, each spacer plate having a second side opposite the first side between the top and bottom edges, the first and second sides of the spacer plates facing the corresponding first and second sides of the fin plates, the bottom edges of the fin plates and the bottom edges of the spacer plates forming a compliant thermal interface configured to interface with an electrical component, the upper edges of the fin plates being located above the upper edges of the spacer plates such that airflow channels are formed above the spacer plates between the fin plates;
a support frame supporting the fin plates and the spacer plates in the plate stack, the support frame including a spring support member extending internally within the plate stack; and
a spring element extending internally within the plate stack, the spring element engaging the spring support member to locate the spring element relative to the support frame, the spring element engaging the fin plates and the spacer plates to bias the fin plates and the spacer plates in a first biasing direction generally toward the electrical component to press the bottom edges of the fin plates and the spacer plates against the electrical component.

2. The heat sink assembly of claim 1, wherein the fin plates are movable relative to the spacer plates and the spacer plates are movable relative to the fin plates.

3. The heat sink assembly of claim 1, wherein the support frame includes a first side panel at a first side of the plate stack and a second side panel at a second side of the plate stack, the spring element extending between the first side panel and the second side panel.

4. The heat sink assembly of claim 3, wherein the spring support member extends across each of the fin plates and each of the spacer plates between the first side panel and the second side panel.

5. The heat sink assembly of claim 1, wherein the spring element extends perpendicular to the fin plates and the spacer plates, the spring support member extending perpendicular to the fin plates and the spacer plates along the spring element to engage the spring element.

6. The heat sink assembly of claim 1, wherein the spring element extends perpendicular to the fin plates and the spacer plates, the spring support member extending parallel to the fin plates and the spacer plates across the spring element to engage the spring element.

7. The heat sink assembly of claim 1, wherein the spring element includes a center body, a front wing extending forwardly from the center body at a downward angle, and a rear wing extending rearwardly from the center body at a downward angle, the spring support member engaging the center body, distal ends of the front wing and the rear wing engaging the fin plates and the spacer plates to press the fin plates and the spacer plates in the first biasing direction.

8. The heat sink assembly of claim 1, wherein the spring element is a front spring element and the spring support member is a front spring support member located proximate to a front of the plate stack, the heat sink assembly further comprising a rear spring element and a rear spring support member located proximate to a rear of the plate stack, the rear spring element engaging the rear spring support member to locate the rear spring element relative to the support frame, the rear spring element engaging the fin plates and the spacer plates to bias the fin plates and the spacer plates in a first biasing direction generally toward the electrical component to press the bottom edges of the fin plates and the spacer plates against the electrical component.

9. The heat sink assembly of claim 1, wherein the spring support element includes a spring support pin extending through the fin plates along a top of the spring element.

10. The heat sink assembly of claim 1, wherein the spring support element includes one or more spring support rails extending through corresponding airflow channels across a top of the spring element.

11. The heat sink assembly of claim 10, wherein the spring support rails are supported by end panels at a front end of the plate stack and a rear end of the plate stack.

12. The heat sink assembly of claim 10, wherein the spring support rails include locating tabs, each locating tab engaging one of the fin plates or one of the spacer plates to locate the spring support rails relative to the spring element within the plate stack.

13. The heat sink assembly of claim 1, wherein the fin plates include fin plate slots and the spacer plates include spacer plate slots, the support frame including plate support elements extending internally through the fin plates in the fin plate slots and the plate support elements extending internally through the spacer plates in the spacer plate slots.

14. The heat sink assembly of claim 13, wherein the fin plate slots are elongated and the spacer plate slots are elongated, the fin plates and the spacer plates being movable relative to the plate support elements with the fin plate slots and the spacer plate slots providing relief relative to the plate support elements to allow the fin plates and the spacer plates to move relative to the plate support elements.

15. The heat sink assembly of claim 1, wherein the fin plates include overlapping regions and the spacer plates include overlapping regions, the fin plates and the spacer plates being internested such that the overlapping regions of the fin plates overlap with the overlapping regions of the spacer plates to thermally couple the fin plates and the spacer plates.

16. A heat sink assembly comprising:
a plate stack including fin plates and spacer plates arranged between the fin plates in a stacked arrangement, each fin plate having a top edge and a bottom edge, each fin plate having a first side between the top and bottom edges, each fin plate having a second side opposite the first side between the top and bottom edges, each spacer plate having a top edge and a bottom edge, each spacer plate having a first side between the top and bottom edges, each spacer plate having a second side opposite the first side between the top and bottom edges, the first and second sides of the spacer plates facing the corresponding first and second sides of the fin plates, the bottom edges of the fin plates and the bottom edges of the spacer plates forming a compliant thermal interface configured to interface with an electrical component, the upper edges of the fin plates being located above the upper edges of the spacer plates such that airflow channels are formed above the spacer plates between the fin plates;
a support frame supporting the fin plates and the spacer plates in the plate stack, the support frame including a first side panel at a first side of the plate stack and a second side panel at a second side of the plate stack, the support frame including a spring support pin extending between the first side panel and the second side panel internally within the plate stack; and
a spring element extending internally within the plate stack, the spring element engaging the spring support pin to locate the spring element relative to the support frame, the spring element engaging the fin plates and the spacer plates to bias the fin plates and the spacer plates in a first biasing direction generally toward the electrical component to press the bottom edges of the fin plates and the spacer plates against the electrical component.

17. The heat sink assembly of claim 16, wherein the spring element extends perpendicular to the fin plates and the spacer plates, the spring support pin extending perpendicular to the fin plates and the spacer plates along the spring element to engage the spring element.

18. The heat sink assembly of claim 16, wherein the spring element includes a center body, a front wing extending forwardly from the center body at a downward angle, and a rear wing extending rearwardly from the center body at a downward angle, the spring support pin extending parallel to and engaging the center body, distal ends of the front wing and the rear wing engaging the fin plates and the spacer plates to press the fin plates and the spacer plates in the first biasing direction.

19. A communication system comprising:
an electrical component having an upper surface, the electrical component having a thermal interface at the upper surface; and
a heat sink assembly thermally coupled to the thermal interface of the electrical component to dissipate heat from the electrical component, the heat sink assembly comprising:
a plate stack including fin plates and spacer plates arranged between the fin plates in a stacked arrangement, each fin plate having a top edge and a bottom edge, each fin plate having a first side between the top and bottom edges, each fin plate having a second side opposite the first side between the top and bottom edges, each spacer plate having a top edge and a bottom edge, each spacer plate having a first side between the top and bottom edges, each spacer plate having a second side opposite the first side between the top and bottom edges, the first and second sides of the spacer plates facing the corresponding first and second sides of the fin plates, the bottom edges of the fin plates and the bottom edges of the spacer plates facing the upper surface of the electrical component and forming a compliant thermal interface engaging the thermal interface of the electrical component, the upper edges of the fin plates being located above the upper edges of the spacer plates such that airflow channels are formed above the spacer plates between the fin plates;
a support frame supporting the fin plates and the spacer plates in the plate stack, the support frame including a spring support member extending internally within the plate stack; and
a spring element extending internally within the plate stack, the spring element engaging the spring support member to locate the spring element relative to the support frame, the spring element engaging the fin plates and the spacer plates to bias the fin plates and the spacer plates in a first biasing direction generally toward the electrical component to press the bottom edges of the fin plates and the spacer plates against the electrical component.

20. The communication system of claim 19, wherein the fin plates are movable relative to the spacer plates and the spacer plates are movable relative to the fin plates to conform to the thermal interface and the upper surface of the electrical component.

* * * * *